United States Patent [19]

Kurashima

[11] Patent Number: 4,937,517
[45] Date of Patent: Jun. 26, 1990

[54] CONSTANT CURRENT SOURCE CIRCUIT
[75] Inventor: Yasumi Kurashima, Tokyo, Japan
[73] Assignee: NEC Corporation, Japan
[21] Appl. No.: 389,278
[22] Filed: Aug. 3, 1989
[30] Foreign Application Priority Data Aug. 5, 1988 [JP] Japan .................................. 63-196710

[51] Int. Cl.⁵ .......................... G05F 3/24; H01L 29/00
[52] U.S. Cl. .................................... 323/315; 307/450;
357/15; 357/67; 357/68
[58] Field of Search ............... 323/312, 315, 316, 317;
307/448, 450, 458; 357/15, 16, 40, 41, 67, 68,
71, 90

[56] References Cited
U.S. PATENT DOCUMENTS 4,031,456  6/1977  Shimada et al. ................... 323/315
4,414,737 11/1983  Menjo et al. ...................... 357/52
4,642,552  2/1987  Suzuki et al. ..................... 323/312
4,727,309  2/1988  Vajdic et al. ..................... 323/315
4,774,205  9/1988  Choi et al. ........................ 357/41
4,775,879 10/1988  Robb et al. ....................... 357/41

Primary Examiner—Peter S. Wong
Attorney, Agent, or Firm—Laff, Whitesel, Conte & Saret

[57] ABSTRACT

A constant current source circuit, in which first and second FET's are formed, is disclosed. The first FET has a source-drain path connected between power voltage lines and a gate connected to one of the power voltage lines with the source in common. The second FET is connected at its drain to a current output node of the constant current source circuit for supplying a constant current to a circuit coupled to the current output node, and at its gate to the drain of the first FET.

21 Claims, 4 Drawing Sheets

CONSTANT CURRENT SOURCE CIRCUIT

BACKGROUND OF THE INVENTION 1. (Field of the Invention)

The present invention relates to a constant current source circuit, and more particularly, to a constant current source circuit formed on a compound semiconductor substrate such as a semi-insulating gallium arsenide (GaAs) substrate.

2. (Description of Related Art)

As shown in FIG. 1A, a conventional constant current source circuit of this kind has the circuit construction wherein the source (S) and gate (G) of a field effect transistor (hereinafter called as FET) 31 are connected to the same power voltage line 310 which is connected to the terminal TP$_{31}$, the gate-source voltage V$_{GS}$ of this FET 31 is fixed to 0 V and the drain (D) is connected to and used as a current output node TO$_{31}$. Alternatively, as shown in FIG. 1B, a resistor element R$_{31}$ is inserted between the source (S) of an FET 32 and the power voltage line 310, a predetermined reference voltage V$_{RR}$, which is generated internally or supplied from an external power source, is applied to the gate (G) of this FET 32 and the drain (D) of the FET 32 is connected to and used as the current output node TO$_{32}$.

The conventional constant current source circuit described above, however, has the construction in which the gate-source voltage V$_{GS}$ is set to 0 V or a predetermined fixed voltage V$_{RR}$ is applied to the gate. Therefore, if the threshold voltage V$_T$ of each FET 31, 32 deviates from the center of the design value due to the fabrication condition or the like, the supply current deviates from a design value, too, so that the noise margin of a logic circuit or an output circuit connected to this constant current source circuit drops or the output level deviates greatly from the design value.

SUMMARY OF THE INVENTION

It is therefore an object of the present invention to provide a constant current source circuit capable of preventing the deviation of the supply current from the design value and also capable of supplying stably a constant current to a circuit connected to this constant current source circuit.

According to a feature of the present invention, there is provided a constant current source circuit which comprises a first power voltage line supplying a first voltage, a second power voltage line supplying a second voltage lower than the first voltage, a third power voltage line supplying a third voltage lower than the first voltage, a current output node, a first resistor element connected at its one end to the first power voltage line, a first FET having a drain connected to the other end of the first resistor element, a source connected to the second power voltage line and a gate connected to the second power voltage line, and a second FET having a drain connected to the current output node, a source connected to the third power voltage line and a gate connected to the drain of the first FET.

Further, a diode element as a level shift diode may be formed and connected between the first resistor element and the first power voltage line, and a second resistor element may be formed and connected between the source of the second FET and the third power voltage line. When the first voltage is a ground voltage (0 volts), the second and third voltages are negative voltages. Favorably, the second voltage (for example, −6.0 volts) is lower than the third voltage (for example, −5.2 volts). However, in some cases, the second and third voltages may be the same value (for example −5.2 volts) by forming continuously the second and third power voltage lines in one line. The constant current source circuit may be connected to a differential logic circuit for supplying a constant current to the logic circuit, or the current output node and second FET of the constant current source circuit may constitute a portion of a level shift circuit of a logic circuit.

Preferably, the constant current source circuit of the present invention is formed on a compound semiconductor substrate such as semi-insulating gallium arsenide substrate such that each of the first and second FET's includes an active impurity layer of one conductivity type (N-type) formed in a major surface of the substrate and having a pair of high impurity concentration portions serving as the source and drain and a low impurity concentration portion provided between and connected to the high impurity concentration portions, the low impurity concentration portion being used as a channel portion of the FET and being connected to the gate to form a Schottky barrier diode between the gate and the surface of the low impurity concentration portion. Also, the diode element may include an active impurity layer of the one conductivity type (N-type) formed in the major surface of the substrate and having a pair of high impurity concentration portions and a low impurity concentration portion provided between and connected to the high impurity concentration portions, an electrode formed on the low impurity concentration portion to form a Schottky barrier diode of the diode element between the electrode and the surface of the low impurity concentration portion, and a wiring connecting the high impurity concentration portions in common such that the electrode serves as the anode of the diode element and the active layer serves as the cathode of the diode element. The diode element of the FET type may be formed with the formation of the first and second FET's, simultaneously, so that the electrode of the diode element has the same material and thickness as those of the gate electrodes of the first and second FET's, and the high and low impurity concentration portions in the active layer of the diode element have the same impurity concentrations and depths as those of the high and low impurity portions in the active layers of the first and second FET's, respectively. Further, the electrode of the diode element may has the same plan figure as that of the gate electrode of every FET, and the active layer including the high and low impurity concentration portions may has the same plan figure as that of the active layer of every FET, if possible.

DETAILED DESCRIPTION OF THE EMBODIMENTS

Figure 1A:
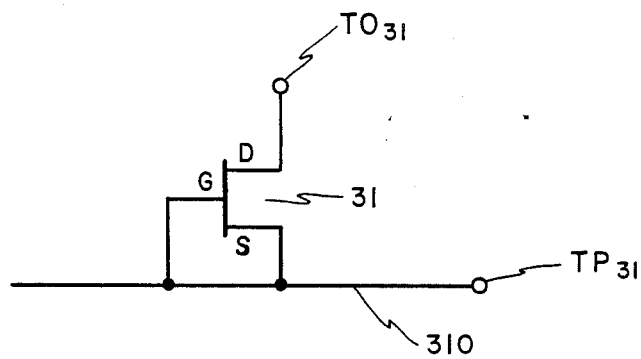
FIGS. 1A and 1B are circuit diagrams showing conventional constant current source circuits, respectively.
Figure 2:
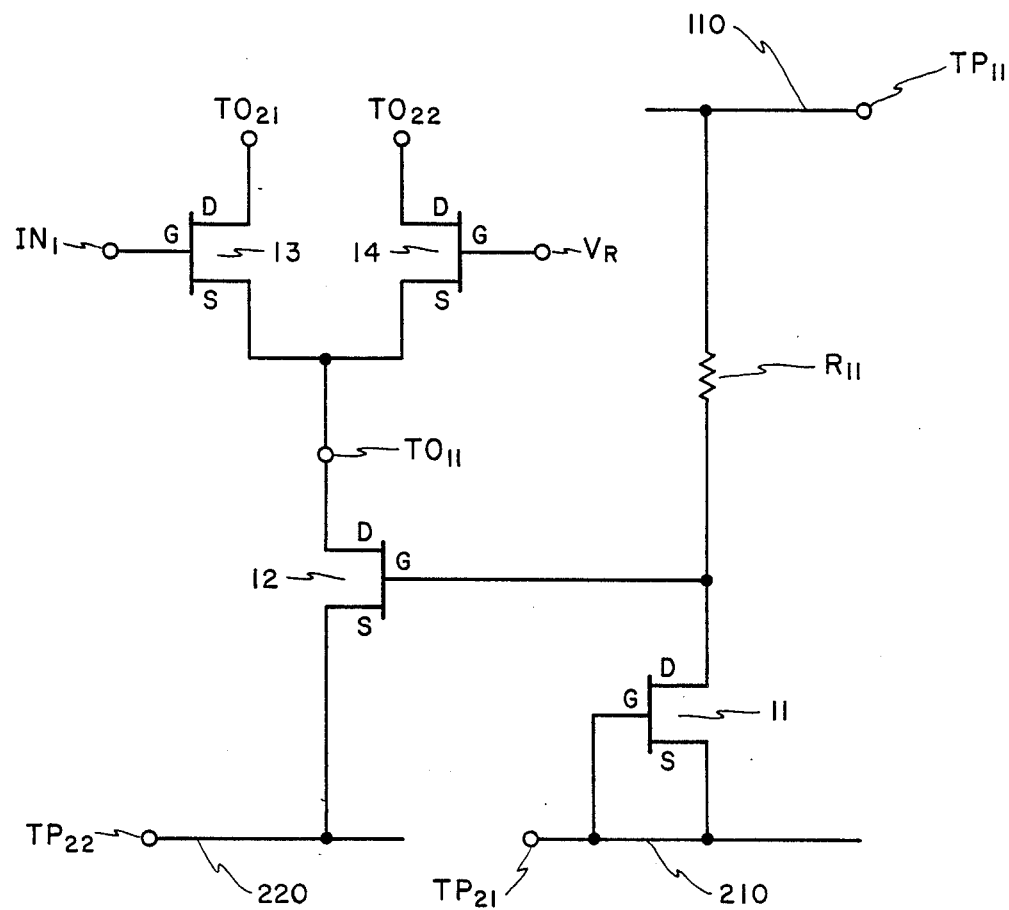
FIG. 2 is a circuit diagram showing a circuit of a first embodiment according to the present invention.

Referring to FIG. 2, a first embodiment of the present invention will be explained. The constant current source circuit comprises a first resistor element $R_{11}$ connected at its one end to a first power voltage line 110 to which a high voltage, for example, a ground voltage; 0 volts is applied through the terminal $TP_{11}$, a first FET 11 connected at its drain(D) to the other end of the first resistor element $R_{11}$ and at its source (S) and gate (G) to a second power voltage line 210 in common to which line 210 a low voltage (an negative voltage), for example, $-6.0$ volts is applied through the terminal $TP_{21}$, and a second FET 12 connected at its drain (D) to a current output node $TO_{11}$ of the constant current source circuit, at its source (S) to a third power voltage line 220 to which a low voltage (an negative voltage), for example, $-5.2$ volts is applied through the terminal $TP_{22}$ and at its gate (G) to the drain of the first FET 11. The constant current source circuit functions as a constant current source of a differential logic circuit including FET's 13 and 14 connected to the current output node $TO_{11}$. When the output terminals $TO_{21}$ and $TO_{22}$ are terminated by terminating resistors (not shown), respectively, an amplified output level determined by the value of the terminating resistor and by the current supplied from the second FET 12 is obtained at the output terminals $TO_{21}$ and $TO_{22}$.

Next, the operation of this embodiment will be described.

It will be assumed hereby that the threshold voltage value $V_T$ of each FET 11, 12 deviates from the design value towards the negative side due to fabrication conditions and environmental conditions. Since the gate-source voltage $V_{GS}$ of the first FET 11 is 0 V and constant, the current flowing into this FET 11 increases due to the deviation of the threshold value of FET 11 towards the negative side so that the voltage drop by the resistor $R_{11}$ becomes great, and therefore, the drain potential of the first FET 11 drops.

On the other hand, since the threshold voltage $V_T$ of the second FET 12 deviates also towards the negative side, the current flowing into this FET 12 tends to increase from the design value. However, since the drain potential of the first FET 11, or in other words, the gate potential of the second FET 12, drops, any influences resulting from the deviation of the threshold voltage value $V_T$ towards the negative side can be offset by designing the dimension of FET's 11, 12 and the values of the resistor $R_{11}$ to suitable values. Consequently, the current flowing through the FET 12, or in other words, the current supplied to the differential logic circuit, can be kept at the design value.

As a result, the output amplitude at the output terminals $TO_{21}$, $TO_{22}$ can be kept constant and the stable output level can be obtained even when the threshold voltage $V_T$ changes.

If the threshold voltage $V_T$ deviates from the design value towards the positive side, on the contrary, the current flowing through the first FET 11 decreases, the potential of the drain of this FET 11 rises and the gate potential of the second FET 12 rises, too, so that the current flowing through the second FET 12 can be kept at the design value.

Figure 3:
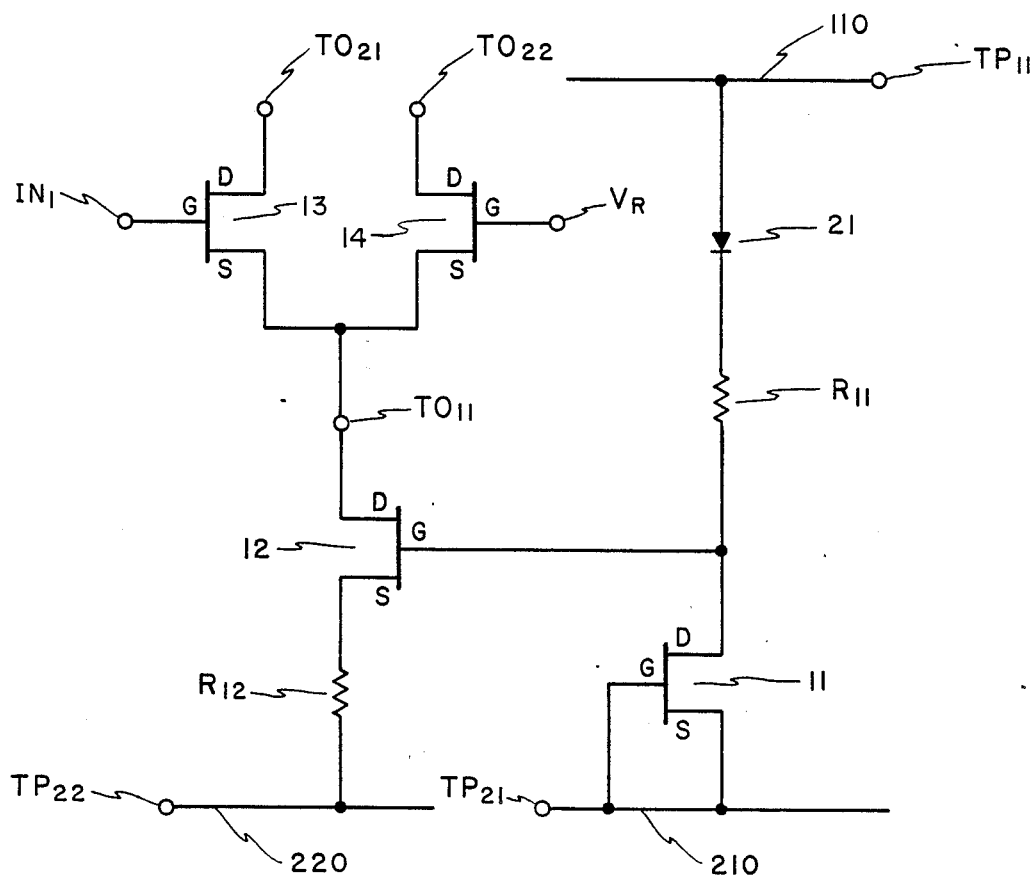
FIG. 3 is a circuit diagram showing a circuit of a second embodiment according to the present invention.

Referring to FIG. 3, a second embodiment of the present invention will be explained. In FIG. 3, the same components as those in FIG. 2 are indicated by the same reference numerals. In the second embodiment, a diode 21 is inserted between the first resistor element $R_{11}$ and the first power voltage line 110, and a second resistor element $R_{12}$ is inserted between the source (S) of the second FET 12 and the third power voltage line 220. The diode 21 functions as a level shift diode by which the change level of the drain voltage of the first FET 11, that is, of the gate voltage of the second FET 12 due to the deviation of the threshold voltage $V_T$ is adjusted to a proper one, and the second resistor element $R_{12}$ functions as a source resistor by which the source voltage of the second FET 12 is adjusted so that a proper change of $V_{SG}$ of the second FET 12 in response to the deviation of the threshold voltage $V_T$ is conducted with the first FET 11, the first resistor element $R_{11}$ and the diode 21.

Figure 1B:
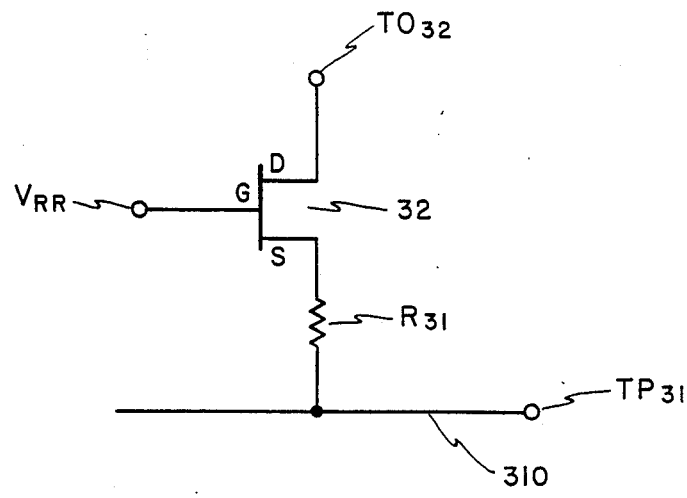

When, the FET's 11 and 12 have the same structure and characteristic each other, that is, the dimensions, impurity profiles and materials in every part are the same each other, and the design center of their threshold voltage $V_T$ is the same value of $-0.4$ volts, for example, both of the resistor elements $R_{11}$ and $R_{12}$ are formed to be 1 K$\Omega$ resistance value with the same dimensions and impurity profiles in every part each other. In this case, even if the threshold voltage $V_T$ of the respective FET's 11 and 12 deviates by $\pm 0.2$ volts from the center value ($-0.4$ volts), the fluctuation of the supply current through the current output node $TO_{11}$ in FIG. 3 in accordance with this embodiment can be kept within 2% with respect to the design value, whereas the supply current flowing the current output node $TO_{32}$ in FIG. 1B of the prior art circuit fluctuates by about 15% by the deviation of $\pm 0.2$ volts of the threshold voltage in the FET 32.

Figure 4A:
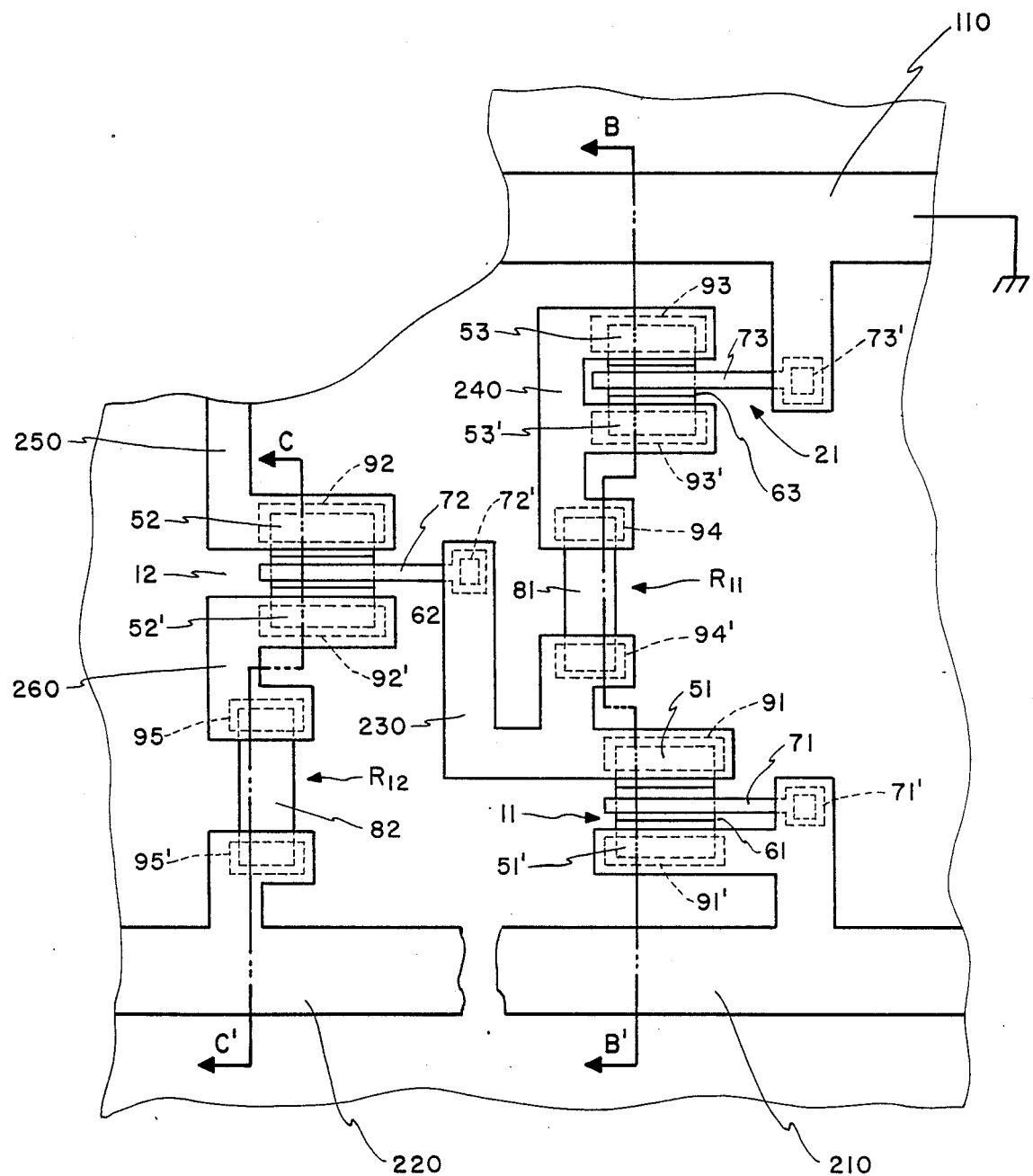
FIG. 4A is a plan view showing the second embodiment.
Figure 4B:
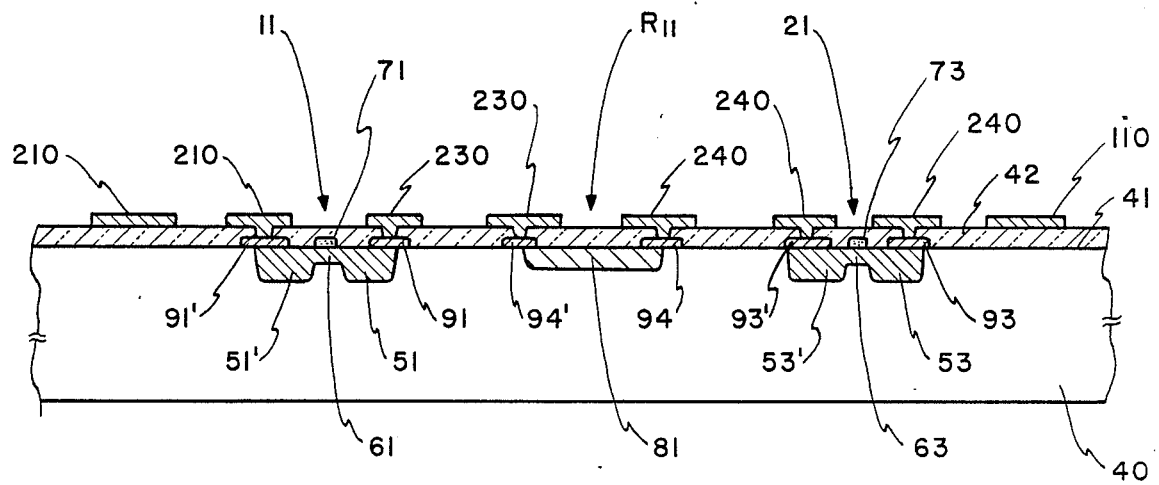
FIGS. 4B and 4C are cross-sectional views taken along lines B-B' and C-C' in FIG. 4A as viewed in the direction of arrows, respectively.
Figure 4C:
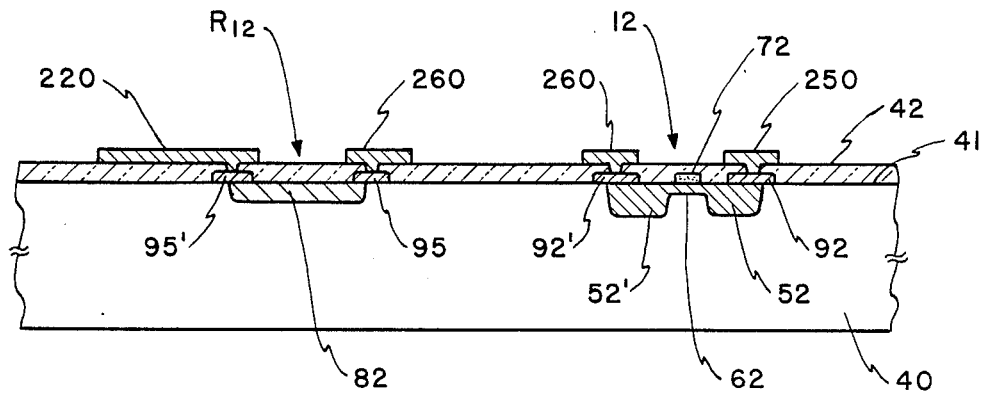

Referring to FIGS. 4A to 4C, the device construction of the second embodiment shown in FIG. 3 will be explained. In a semi-insulating gallium arsenide (GaAs) substrate 40, pairs of N-type high impurity concentration regions 51-51', 52-52' and 53-53' and N-type low impurity concentration regions 61, 62 and 63 between and connected to respective high impurity concentration regions are formed from the major surface 41 of the substrate 40. Each of the high impurity concentration regions and each of the low impurity regions have the same dimensions and impurity profiles. Also, N-type impurity regions 81 and 82 are formed from the major surface 41 in the substrate 40 with the same dimensions and impurity profile each other. In each section, the pair of $N^+$-type impurity regions and the $N^-$-type impurity region constitute an active impurity layer. Stripe-like electrodes 71, 72 and 73 made of tungstein silicide (WSi) are formed on and contacted to the surface of the N-type low impurity concentration regions 61, 62 and 63 to form Schottky barrier diodes therebetween, respectively, and extend on the semi-insulating major surface of the substrate. Island-like electrodes 91, 91', 92, 92', 93, 93', 94, 94', 95 and 95' each consisting of an Au-Ge (gold-germanium) film as a lower level film contacted to impurity regions and a Ni (nickel) film as an upper level film formed on the Au-Ge film, are formed on and ohmic contacted to respective impurity regions, and wirings 110, 210, 220, 230, 240, 250 and 260 each consisting of a lower level titanium (Ti) film, a middle level platinum (Pt) film formed on the titanium film and an upper level gold film formed on the platinum film, are formed on an inter-ply insulating film 42 and connected to corresponding stripe-like and island-like electrodes through contact holes (in FIGS. 4B and 4C, and 71', 72'and 73' in FIG. 4A) formed in the interply insulating-film 42.

Namely, the source electrode 91' connected to the N+-type source 51' of the first FET 11 and the gate electrode 71 contacted to the N--type channel region 61 of the first FET 11 for forming the Schottky barrier diode there are commonly connected to the wiring 210 of the second power voltage line supplying −6.0 volts. The drain electrode 91 connected to the N+-type drain 51 (D) of the first FET 11, the gate electrode 72 contacted to the N--type channel region 62 of the second FET 12 for forming the Schottky barrier diode there and the electrode 94' contacted to one end of the N-type region 81 of the first resistor element $R_{11}$ are connected to the wiring 230. The drain electrode 92 contacted to the N+-type drain 52 of the second FET 12 is connected to the wiring 250 which is extended to the current output node $TO_{11}$ (not shown in FIG. 4), and the source electrode 92' contacted to the N+-type source 52' of the second FET 12 and the electrode 95 contacted to one end of the N-type region 82 of the second resistor element $R_{12}$ are connected to the wiring 260. The electrode 95' contacted to the other end of the N-type region 82 of the second resistor element $R_{12}$ is connected to the wiring of the third voltage line supplying −5.2 volts. The anode electrode 73 of the diode element 21 contacted to the N--type portion 63 for forming the Schottky barrier diode using as the diode element is connected to the wiring 110 of the first power voltage line supplying 0 volts (ground voltage). The electrode 93, 93' contacted to the N+-type regions 53, 53', respectively, are commonly contacted to the wiring 240 so that the N+-type regions 53, 53' and the N--type region 63 serve as the cathode of the diode element 21. The common connection wiring 240 connects to the electrode 94 contacted to the other end of the N-type region 81 of the first resistor element $R_{11}$.

Figure 5:
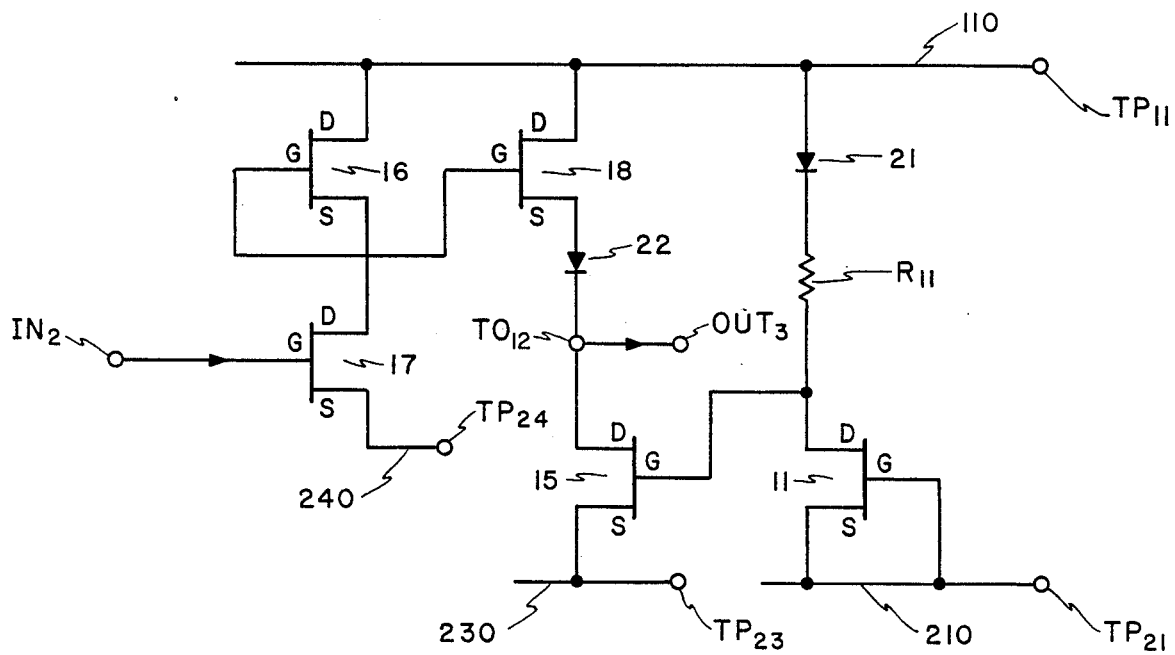
FIG. 5 is a circuit diagram showing a circuit of a third embodiment according to the present invention.

Referring to FIG. 5, the third embodiment of the present invention will be explained. In FIG. 5, the same components as those in FIG. 3 are indicated by the same reference numerals. The constant current source circuit includes the diode 21, the first resistor element $R_{11}$, the first FET 11, a second FET 15, and a current output node $TO_{12}$. As the second FET 12 in FIGS. 3 and 4, the second FET 15 in FIG. 5 has also the same construction such as dimensions, impurity profiles, materials and the same characteristics such as threshold voltage $V_T$ as of the first FET 11. The output node $TO_{12}$ is connected to a BFL (Buffered FET Logic) circuit consisting of FET's 16, 17, 18 which are the same compound FET's (MESFET's) as FET's 11 and 15; each FET is formed on a compound semiconductor substrate such as semi-insulating gallium-arsenide (GeAs) substrate and has the Schottky barrier diode at the gate structure and a diode 22 as the diode 21. The BFL circuit is connected to the power voltage line 110 supplying 0 volts through the terminal $TP_{11}$, to a power voltage line 230 supplying −3.3 volts through the terminal $TP_{23}$ and to a power voltage line 240 supplying −2.0 volts through the terminal $TP_{24}$, and outputs the output signal $OUT_3$ from the current output node $TO_{12}$. Input signals $IN_2$ are inputted at the gate of the FET 17. Apparently from FIG. 5, a portion consisting of the FET 15 and the node $TO_{12}$ of the level shift circuit of the BFL circuit is a portion of the constant current source circuit. Even when the threshold voltages of the FET's 11, 15 deviate, the current flowing through the FET 15 can be kept constant by the same operation as in the first and second embodiments in accordance with this embodiment. Accordingly, this embodiment provides the advantages in that the delay time and noise margin of the BFL circuit can be kept constant irrespective of the change of the threshold voltage $V_T$.

Incidentally, in the second and third embodiment, the resistor $R_{11}$ may be connected directly to the power source terminal $TP_{11}$ and an FET may be used in place of the diode 21.

In accordance with the present invention described above, the change of the current flowing through the first FET due to the deviation of the threshold voltage of the first FET is transmitted to the second FET so as to offset the change of the current flowing through the second FET due to the deviation of the threshold voltage of the second FET. According to this arrangement, even when the threshold voltage deviates, a stable constant current can be supplied as designed to the circuit connected to the current output terminals.

What is claimed is:

1. A constant current source circuit comprising a first power voltage line supplying a first voltage, a second power voltage line supplying a second voltage lower than said first voltage, a third power voltage line supplying a third voltage lower than said first voltage, a current output node, a first resistor element connected at its one end to said first power voltage line, a first field effect transistor having a drain connected to the other end of said first resistor element, a source connected to said second power voltage line and a gate connected to said second power voltage line, and a second field effect transistor having a drain connected to said current Output node, a source connected to said third power voltage line and a gate connected to said drain of said first transistor.

2. A constant current source circuit of claim 1 further comprising a diode element connected between said first resistor element and said first power voltage line.

3. A constant current source circuit of claim 1 further comprising a second resistor element connected between said source of said second transistor and said third power voltage line.

4. A constant current source circuit of claim 1, in which said second voltage is lower than said third voltage.

5. A constant current source circuit of claim 1, in which said second voltage is equal to said third voltage, and said second and third power voltage lines are continuously formed each other.

6. A constant current source circuit of claim 1, in which each of said first and second transistors is a compound semiconductor field effect transistors and each of said gates forms a Schottky barrier diode.

7. A constant current source circuit of claim 1, in which said current output node is connected to a differential logic circuit for supplying a constant current to said differential logic circuit.

8. A constant current source circuit of claim 1, in which said current output node and said second transistor constitute a portion of a level shift circuit of a logic circuit.

9. A constant current source circuit comprising a first power voltage line supplying a first voltage, a second power voltage line supplying a second voltage lower than said first voltage, a third voltage line supplying a third voltage lower than said first voltage, a current output node, a diode element having an anode connected to said first voltage line and a cathode, a first resistor element connected at its one end to said cathode of said diode element, a first field effect transistor having a drain connected to the other end of said first resistor element, a source connected to said second power voltage line and a gate connected to said second power voltage line, a second field effect transistor having a drain connected to said current output node, a source and a gate connected to said drain of said first transistor, and a second resistor element connected at its one end to said source of said second transistor and at its the other end to said third power voltage line.

10. A constant current source circuit of claim 9, in which said circuit is formed on a compound semiconductor substrate.

11. A constant current source circuit of claim 10, in which said compound semiconductor substrate is a semi-insulating gallium arsenide substrate.

12. A constant current source circuit of claim 10, in which each of said first and second transistors includes an active impurity layer of one conductivity type formed in a major surface of said substrate, said active impurity layer having a pair of high impurity concentration portions serving as said source and drain and a low impurity concentration portion provided between and connected to said high impurity concentration portions, said low impurity concentration portion being used as a channel portion of said transistor and being connected to said gate to form a Schottky barrier diode between said gate and the surface of said low impurity concentration portion.

13. A constant current source circuit of claim 12, in which said diode element includes an active impurity layer of said one conductivity type formed in said major surface of said substrate and having a pair of high impurity concentration portions and a low impurity concentration portion provided between and connected to said high impurity concentration portions, an electrode formed on said low impurity concentration portion to form a Schottky barrier diode of said diode element between said electrode and the surface of said low impurity concentration portion, and a wiring connecting said high impurity concentration portions in common, whereby, said electrode is said anode of said diode element, and said active layer is said cathode of said diode element.

14. A constant current source circuit of claim 13, in which said electrode of said diode element has the same material and thickness as those of said gate electrodes of said transistors, and said high and low impurity concentration portions in said active layer of said diode element have the same impurity concentrations and depths as those of said high and low impurity portions in said active layers of said transistors, respectively.

15. A constant current source circuit of claim 14, in which said electrode of said diode element has the same plan figure as that of said gate of every said transistor, and said active layer including said high and low impurity concentration portions of said diode element has the same plan figure as that of said active layer of every said transistor.

16. A constant current source circuit of claim 12, in which said one conductivity type is N-type.

17. A constant current source circuit of claim 9, in which said second voltage is lower than said third voltage.

18. A constant current source circuit of claim 9, in which said second voltage is equal to said third voltage, and said second and third power voltage lines are continuously formed each other.

19. A constant current source circuit of claim 9, in which each of said first and second transistors is a compound semiconductor field effect transistor and each of said gates forms a Schottky barrier diode.

20. A constant current source circuit of claim 9, in which said current output node is connected to a differential logic circuit for supplying a constant current to said differential logic circuit.

21. A constant current source circuit of claim 9, in which said current output node and said second transistor constitute a portion of a level shift circuit of a logic circuit.

* * * * *